(12) United States Patent
Ashizawa

(10) Patent No.: US 9,087,564 B2
(45) Date of Patent: Jul. 21, 2015

(54) SEMICONDUCTOR STORAGE HAVING DIFFERENT OPERATION MODES

(75) Inventor: Tetsuo Ashizawa, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 621 days.

(21) Appl. No.: 13/444,479

(22) Filed: Apr. 11, 2012

(65) Prior Publication Data

US 2012/0287741 A1    Nov. 15, 2012

(30) Foreign Application Priority Data

May 11, 2011    (JP) ................... 2011-106393

(51) Int. Cl.
*G11C 7/00* (2006.01)
*G11C 7/12* (2006.01)
*G11C 11/417* (2006.01)

(52) U.S. Cl.
CPC ............... *G11C 7/12* (2013.01); *G11C 11/417* (2013.01)

(58) Field of Classification Search
CPC ...... G11C 11/417; G11C 7/12; G11C 7/1048; G11C 5/148; G11C 2207/2227; G11C 2211/4067
USPC .......................... 365/229, 203, 185.26, 185.25
See application file for complete search history.

(56) References Cited

U.S. PATENT DOCUMENTS

| | | | | |
|---|---|---|---|---|
| 6,333,874 B2 * | 12/2001 | Yamauchi | ................. | 365/189.09 |
| 2001/0028591 A1 * | 10/2001 | Yamauchi | ..................... | 365/227 |
| 2004/0042325 A1 * | 3/2004 | Ashizawa | ...................... | 365/232 |
| 2005/0157576 A1 * | 7/2005 | Sato et al. | ..................... | 365/222 |
| 2006/0087898 A1 * | 4/2006 | Xi et al. | .................... | 365/189.09 |
| 2006/0158943 A1 * | 7/2006 | Park et al. | ..................... | 365/203 |
| 2010/0124103 A1 * | 5/2010 | Kim et al. | ..................... | 365/163 |
| 2011/0149666 A1 * | 6/2011 | Chang et al. | .................. | 365/203 |
| 2013/0088932 A1 * | 4/2013 | Yamagami | .................... | 365/203 |

FOREIGN PATENT DOCUMENTS

| | | |
|---|---|---|
| JP | 01-098186 A | 4/1989 |
| JP | 02-148497 A | 6/1990 |
| JP | 2001-319479 A | 11/2001 |
| JP | 2001-344979 | 12/2001 |
| JP | 2004-095000 | 3/2004 |
| JP | 2006-196167 | 7/2006 |
| JP | 2010-528401 | 8/2010 |
| WO | WO 2008/0144526 A1 | 11/2008 |

OTHER PUBLICATIONS

Japanese Patent Office Action, with partial translation, issued on Jun. 10, 2014 for Japanese Patent Application No. 2011-106393.

* cited by examiner

*Primary Examiner* — Vanthu Nguyen
*Assistant Examiner* — Khamdan Alrobaie
(74) *Attorney, Agent, or Firm* — Arent Fox LLP

(57) ABSTRACT

An SRAM macro operates in a normal operation mode in which a plurality of memory-cell array blocks are accessible and in a low power mode in which bit lines in the memory-cell array blocks are left floating. When the SRAM macro returns from the low power mode to the normal operation mode, the bit lines in only memory-cell array blocks to be accessed among the plurality of memory-cell array blocks are precharged in sequence. This allows the peak of precharging current flowing into the SRAM macro to be dispersed.

1 Claim, 6 Drawing Sheets

FIG. 5

| P (Set) | BLK (Reset) | PM (Q) |
|---|---|---|
| 0 | 0 | OUTPUT MAINTAINED |
| 0 | 1 | SET TO 0 |
| 1 | 0 | SET TO 1 |
| 1 | 1 | INPUT FORBIDDEN |

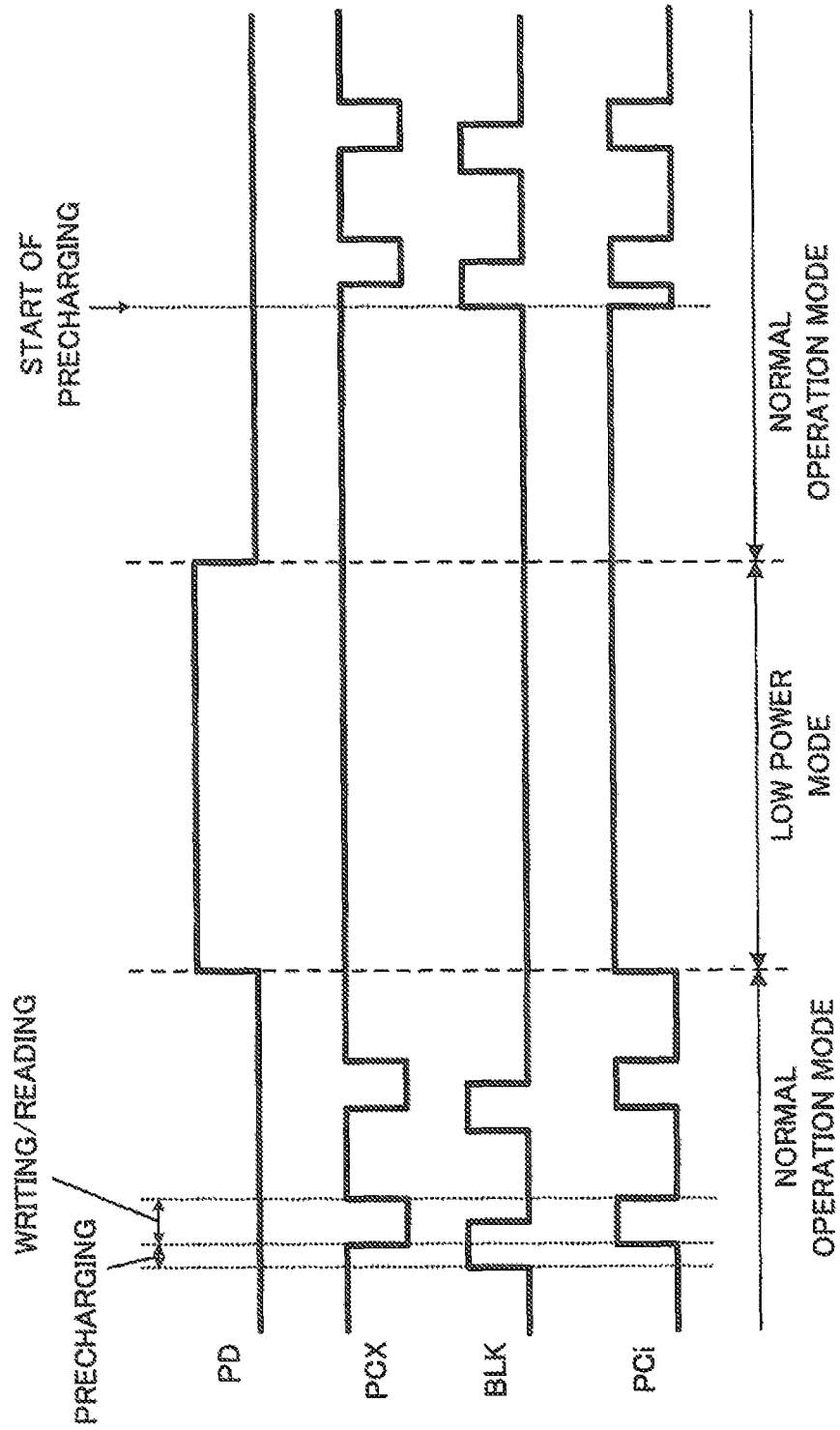

SEMICONDUCTOR STORAGE HAVING DIFFERENT OPERATION MODES

CROSS-REFERENCE TO RELATED APPLICATION

This application is based upon and claims the benefit of priority of the prior Japanese Patent Application No. 2011-106393, filed on May 11, 2011, the entire contents of which are incorporated herein by reference.

FIELD

The embodiment discussed herein is related to semiconductor storages.

BACKGROUND

Reduction in standby power consumption is an important issue for semiconductor circuits used in portable devices and the like. In order to reduce standby power consumed by semiconductor circuits, power to the semiconductor circuits may be partially cut off using switches provided for the semiconductor circuits when the semiconductor circuits are not in use. Such a mode of reducing standby power consumption by cutting power to the circuits that are not in use for a predetermined period of time is called, for example, a low power mode as distinguished from a normal operation mode.

In the low power mode, memory information in memory macros (semiconductor storages) such as static random access memories (SRAMs) is destroyed when power to memory arrays is cut off. To avoid this, power to peripheral circuits such as predecoders and word line drivers or power to bit lines connected to memory cells is cut off so that standby power consumption is reduced.

In some technologies, power consumed by memory macros such as SRAMs is reduced by controlling bit lines in columns to be precharged or timing of precharging bit lines while memory cell arrays are accessed. In addition, memory cell arrays are divided into a plurality of blocks in order to increase operating speed of memory macros such as SRAMs (see, for example, Japanese aid-open Patent Publication Nos. 01-09816, 02-148497, and 2001-319479).

Herein, memory macros that may operate in a low power mode, in which power to bit lines connected to memory cell of memory cell arrays is cut so that the bit lines are left floating, may have a problem as described below.

For example, when memory macros, switch from a low power mode to a normal operation mode in which memory cell arrays are accessible, all bit lines that have been left floating are reconnected to a power source and precharged on the basis of control signals that control the mode transition. At this moment, however, a relatively high current may flow into the memory macros, and a voltage drop may occur in the entire chip including the memory macros since all bit lines are simultaneously reconnected to the power source. In this case, memory information held in the memory macros may be destroyed.

This problem may become more serious as the capacity of memory macros included in chips increases.

SUMMARY

According to one aspect of the present invention, there is provided a semiconductor storage having a plurality of memory-cell array blocks including bit lines connected to memory cells, which operates in a first mode the memory-cell array blocks to be accessible and in a second mode the bit lines in the memory-cell array blocks to be floating level. The semiconductor storage includes a decoder circuit which precharges the bit lines included in only memory-cell array blocks to be accessed among the plurality of memory-cell array blocks in sequence when the semiconductor storage shifts from the second mode to the first mode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is an example, truth table of a flip-flop; and

FIG. 6 is an example timing chart.

DESCRIPTION OF EMBODIMENTS

A semiconductor storage will now be described, in detail by taking an SRAM macro as an example.

First, a layered structure applied to the SRAM macro will be described.

Figure 1:
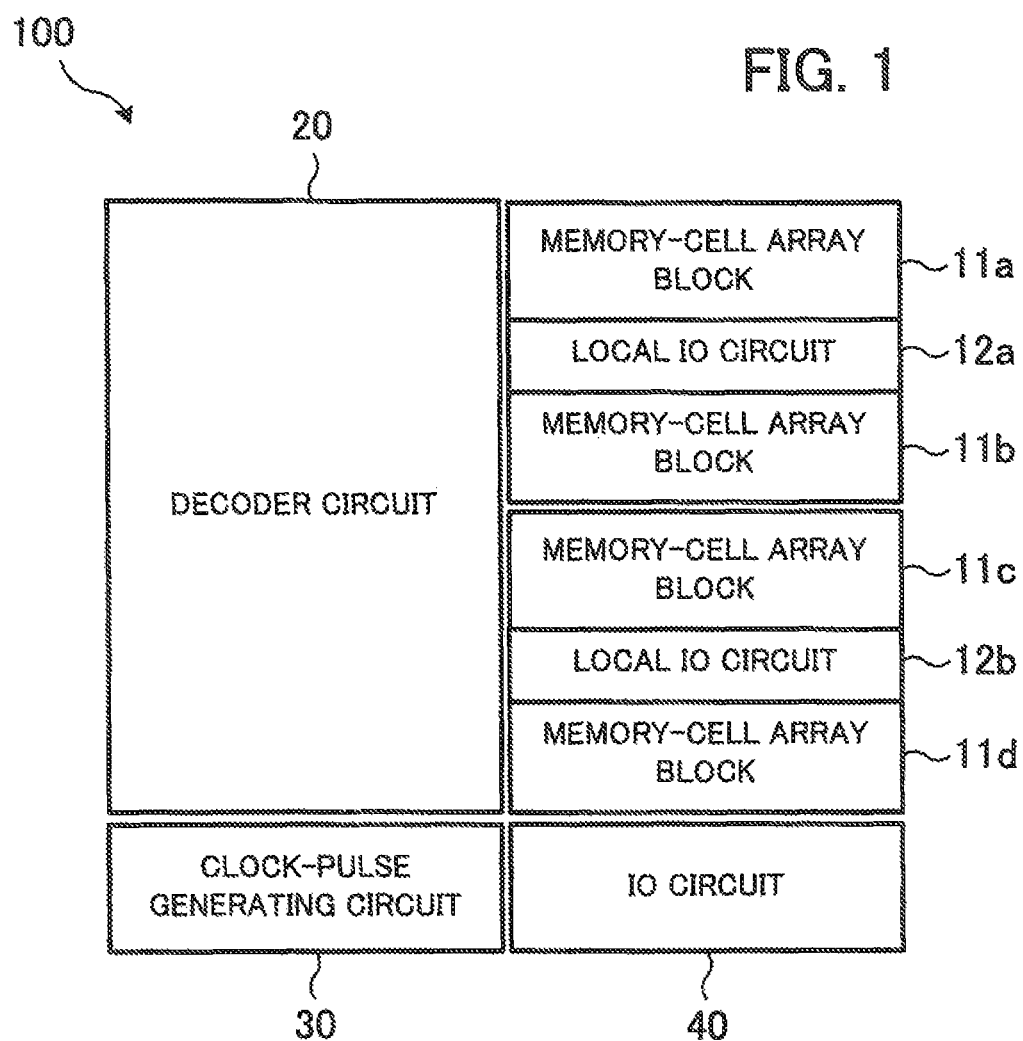
FIG. 1 illustrates an example of a layered SRAM macro.

FIG. 1 illustrates an example of a layered SRAM macro.

A SRAM macro 100 illustrated in FIG. 1 includes four memory-cell array blocks 11a to 11d and two local IO circuits 12a and 12b. The SRAM macro 100 further includes a clock-pulse generating circuit 30 that generates internal control signals, a decoder circuit 20 that selects the memory-cell array blocks 11a to 11d in accordance with specified addresses, and an IO circuit 40. The memory-cell array blocks 11a and 11b are connected to the local IO circuit 12a, and the memory-cell array blocks 11c and 11d are connected to the local IO circuit 12b. The local IO circuits 12a and 12b are connected to the IO circuit 40 at the lowest end of the macro.

Figure 2:
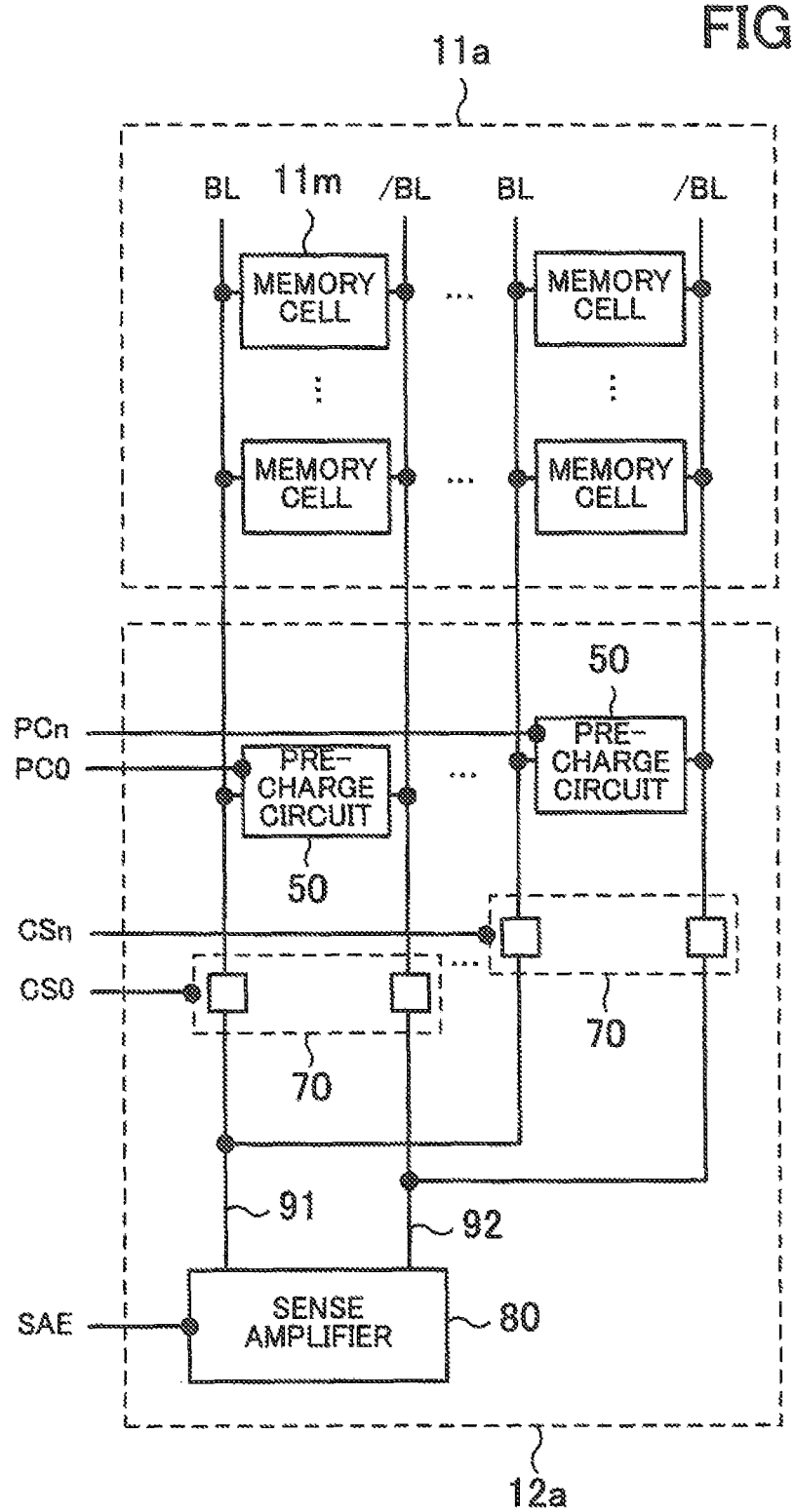
FIG. 2, illustrates an example configuration of part of a memory-cell array block and part of a local IO circuit in the SRAM macro.

FIG. 2 illustrates an example configuration of part of a memory-cell array block and part of a local IO circuit in the SRAM macro. Specifically, FIG. 2 illustrates part of the memory-cell array block 11a and part of the local IO circuit 12a illustrated in FIG. 1. In FIG. 2, word lines are not illustrated.

The memory-cell array block 11a includes a plurality of memory cells 11m and a plurality of bit line pairs BL and /BL connected to the memory cells 11m. The local IO circuit 12a includes precharge circuits 50 and column switches 70 each connected to a corresponding bit line pair BL and /BL in the memory-bell array block 11a and a sense amplifier 80 to which the bit line pairs BL and /BL are connected via data bus lines 91 and 92.

Each of the precharge circuits 50 connects a power source to the bit line pair BL and /BL connected thereto so that the bit lines are precharged, or cuts the power source from the bit line pair BL and /BL so that the bit lines are left floating on the basis of precharge signals PCi (i=0 to n). The column switches 70 are used to select predetermined bit line pairs BL and /BL in the memory-cell array block 11a (column selection) on the basis of column selection signals CSi (i=0 to n). When one of the column switches 70 is selected on the basis of the column selection signals CSi, the bit line pair BL and /BL in the selected column are connected to the data bus lines 91 and 92, respectively. With this, the amplitudes of signals of the bit line pair BL and /BL in the selected column are transmitted to the data bus lines 91 and 92, respectively. After the amplitudes of signals of the bit line pair BL and /BL in the selected column are transmitted to the data bus lines 91 and 92, respectively, the column switch 70 is closed, and the sense amplifier 80 starts on the basis of a sense-amplifier starting signal SAE. This causes the signals on the data bus lines 91 and 92 to be amplified by the sense amplifier 80 and to be output from the sense amplifier 8

The local IO circuit 12a further includes precharge circuits and column switches each connected to a corresponding bit line pair BL and /BL in the other memory-cell array block 11b (see FIG. 1), which is connected to the local IO circuit 12a as is the memory-cell array block 11a illustrated in FIG. 2. The sense amplifier 80 is commonly used by both the memory-cell array blocks 11a and 11b, that is, the bit line pairs BL and /BL selected by the column switches in the memory-cell array block 11b are connected to the sense amplifier 80, and the amplitudes of the signals are amplified.

Similarly, the local IO circuit 12b illustrated in FIG. 1 includes precharge circuits and column switches provided for the memory-cell array blocks 11c and 11d and a sense amplifier commonly used by the memory-cell array blocks 11c and 11d.

The configuration of the SRAM macro 100 will be described in more detail.

The decoder circuit 20 illustrated in FIG. 1 includes a word line driver that selects predetermined word lines connected to the memory cells in the memory-cell array blocks 11a to 11d and a circuit that controls the column switches included in the local IO circuits 12a and 12b. The decoder circuit 20 further includes a circuit (mode control circuit) that controls mode transition of the SRAM macro 100 to a low power mode and from the low power mode to a normal operation mode. The normal operation mode and the low power mode will be described below. The mode control circuit is connected to the precharge circuits in the local IO circuits 12a and 12b, and controls precharging and floating of the bit lines using the precharge circuits.

The clock-pulse generating circuit 30 generates internal control signals on the basis of a clock signal and an address signal input from the outside. The decoder circuit 20 generates various signals on the basis of the internal control signals generated by the clock-pulse generating circuit 30. The decoder circuit 20 generates, for example, signals used to select predetermined word lines using the word line driver, signals used to select predetermined columns using the column switches, signals to start the sense amplifiers, and signals used to control the mode control circuit and the precharge circuits.

The IO circuit 40 writes to and reads from the SRAM macro 100 in cooperation with the memory-cell array blocks 11a to 11d and the local IO circuits 12a and 12b. For example, the IO circuit 40 is connected to the local IO circuits 12a and 12b by a bit line (global bit line) to read information stored in the memory-cell array blocks 11a to 11d using the bit line.

The above-described layered structure may reduce the number of memory cells connected to the bit lines, and thereby reduce the load on the bit lines during reading from and writing to the memory-cell array blocks 11a to 11d. This may lead to an increase in processing speed of the SRAM macro 10

The SRAM macro 100 operates in a normal operation mode in which the memory-cell array blocks 11a to 11d are accessible. In addition, the SRAM macro 100 operates in a mode in which all bit lines that belong to the memory-cell array blocks 11a to 11d are left floating. Herein, such a mode is referred to as a "low power mode". For example, the SRAM macro 100 switches to the low power mode on the basis of a predetermined control signal when any of the memory-cell array blocks 11a to 11d is not accessed for a predetermined period of time. Transition to the low power mode enables a reduction in standby power consumption.

Herein, an example circuit that leaves the bit lines floating during the low power mode will be described.

First, an embodiment of an SRAM macro will be described.

Figure 3:
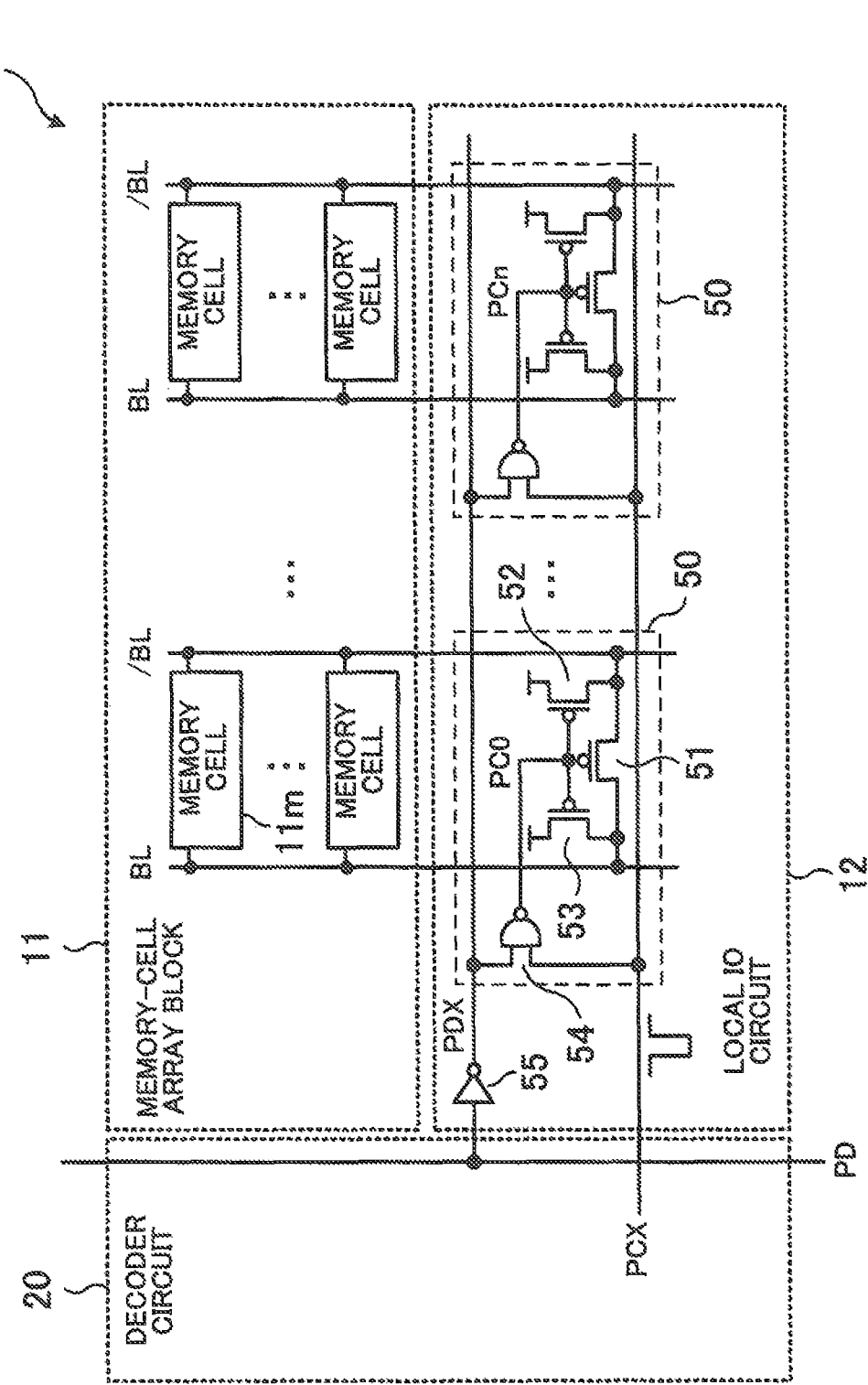
FIG. 3 is a first example circuit diagram of the SRAM macro.

FIG. 3 is an example circuit diagram of a SRAM macro.

FIG. 3 illustrates one of memory-cell array blocks 11 (11a to 11d), part of a local 10 circuit 12 (12a or 12b) connected to the memory-cell array block 11, and part of a decoder circuit 20 included in an SRAM macro 100A. In FIG. 3, word lines are not illustrated.

In the memory-cell array block 11, a predetermined number of memory cells 11m are connected to a corresponding bit line pair BL and /BL. Each bit line pair BL and /BL is connected to a corresponding precharge circuit 50 included in the local IO circuit 12.

The precharge circuits 50 each include, for example, p-type metal-oxide-semiconductor field-effect transistors (pMOSFETs or pMOSs) 51, 52, and 53 and a NAND gate circuit 54. The gates of the pMOSs 51, 52, and 53 in each precharge circuit 50 receive output from a corresponding NAND gate circuit 54 as a precharge signal PCi (i=0 to n).

When all the pMOSs 51, 52, and 53 are turned on by the precharge signals PCi, the precharge circuits 50 precharge the respective bit line pairs BL and /BL connected thereto to a supply voltage (VDD) level (high (H) level). When all the pMOSs 51, 52, and 53 are turned off, the precharge circuits 50 cut the respective bit line pairs BL and /BL connected thereto from a power source so that the bit line pairs BL and /BL are left floating (low (L) level).

The NAND gate circuits 54 that output the precharge signals PCi receive an inverted signal obtained by inverting a low-power-mode control signal PD and a precharge control signal PCX output from the decoder circuit 2

The low-power-mode control signal PD controls switching between the normal operation mode and the low power mode. The low-power-mode control signal PD is input to the NAND gate circuits 54 via a NOT gate (inverter) circuit 55 provided for the local IO circuit 12. The precharge control signal PCX controls timing of precharging. The precharge control signal PCX is processed by the decoder circuit 20 on the basis of internal control signals generated at a clock-pulse generating circuit 30, and is input to the local IO circuit 12.

In the normal operation mode in which the SRAM macro 100A is accessible, the low-power-mode control signal PD is set to the L level. The low-power-mode control signal PD is inverted by the inverter circuit 55, and the inverted H-level output signal PDX is input to the NAND gate circuits 54.

Before writing or reading in the normal operation mode, the precharge control signal PCX input to the local IO circuit 12 to be accessed is set to the H level, and the H-level precharge control signal PCX is input to the NAND gate circuits 54. At this moment, the output from the NAND gate circuits 54, that is, the precharge signals PCi are set to the L level. This causes all the pMOSs 51, 52, and 53 of the precharge circuits 50 to be turned on, and thereby causes the bit line pairs BL and /BL to be connected to the power source. With this, the bit line pairs BL and /BL are precharged.

During writing and reading in the normal operation mode, the precharge control signal PCX input to the local IO circuit 12 to be accessed is set to the L level, and the L-level precharge control signal PCX is input to the NAND gate circuits 54. At this moment, the precharge signals PCi serving as the output from the NAND gate circuits 54 are set to the H level. This causes all the pMOSs 51, 52, and 53 of the precharge circuits 50 to be turned off, and thereby causes the bit line pairs BL and /BL to be cut from the power source. With this, the bit line pairs BL and /BL are left floating, and the SRAM macro becomes writable and readable. Subsequently, when the precharge control signal PCX is switched from the L level to the H level, the bit line, pairs BL and /BL are precharged again.

When any of the memory-cell array blocks 11 including that illustrated in FIG. 3 is not accessed for a predetermined period of time, the SRAM macro 100A switches (shifts) to the low power mode.

In the example of the memory-cell array block 11 illustrated in FIG. 3, the low-power-mode control signal PD is set to the H level in the low power mode. In this case, the precharge signals PCi serving as the output from the NAND gate circuits 54 are at the H level whatever the value of the precharge control signal PCX may be since the output signal PDX of the inverter circuit 55 is at the L level. This causes all the pMOSs 51, 52, and 53 of the precharge circuits 50 to be turned off, and thereby causes the bit line pairs BL and /BL that belong to the memory-cell array block 11 to be left floating.

The same applies to all the memory-cell array blocks included in the SRAM macro 100A in the low power mode. In the SRAM macro 100A, transition to the low power mode causes the bit lines BL and /BL in all the memory-cell array blocks to be left floating simultaneously, and thereby leads to a reduction in leakage current passing from the bit lines BL and /BL to the ground of the memory cells 11m. That is, in the memory cells 11m of the SRAM macro 100A, the transition to the low power mode may lead to a reduction in leakage current passing from transfer transistors connected to the bit lines BL and /BL to the ground to which driver transistors are connected. Such a reduction in leakage current in the entire SRAM macro 100A may lead to a reduction in power consumption during standby.

When the SRAM macro 100A returns from the low power mode to the normal operation mode, the precharge control signal PCX is set to the H level and the low-power-mode control signal PD is set to the L level so that the bit lines BL and /BL are precharged.

In the case of the SRAM macro 100A illustrated in FIG. 3, the L-level low-power-mode control signal PD is input to all the local IO circuits 12 in the SRAM macro 100A as described above when the SRAM macro 100A returns from the low power mode. When the precharge signals PCi are set to the L level in the precharge circuits 50 of all the local IO circuits 12, all the bit lines BL and /BL in the SRAM macro 100A are simultaneously connected to the power source, and are precharged.

At this moment, a relatively high current for precharging all the bit lines BL and /BL flows into the SRAM macro 100A, and may cause a voltage drop in a chip (semiconductor device) in which the SRAM macro 100A is included depending on the capacity of the SRAM macro 100A. Such a voltage drop in the SRAM macro 100A may cause memory information destruction.

In cases where a plurality of SRAM macros 100A are included in a chip, delay circuits may disperse the peak of the current flowing into the SRAM macros 100A. However, in cases where one of the SRAM macros 100A is large or one of the SRAM macro array blocks is large, for example, a relatively high current may flow into the corresponding SRAM macro 100A when the SRAM macro 100A returns from the low power mode. In this case, a voltage drop may occur in the chip, and may results in memory information destruction as described above.

Figure 4:
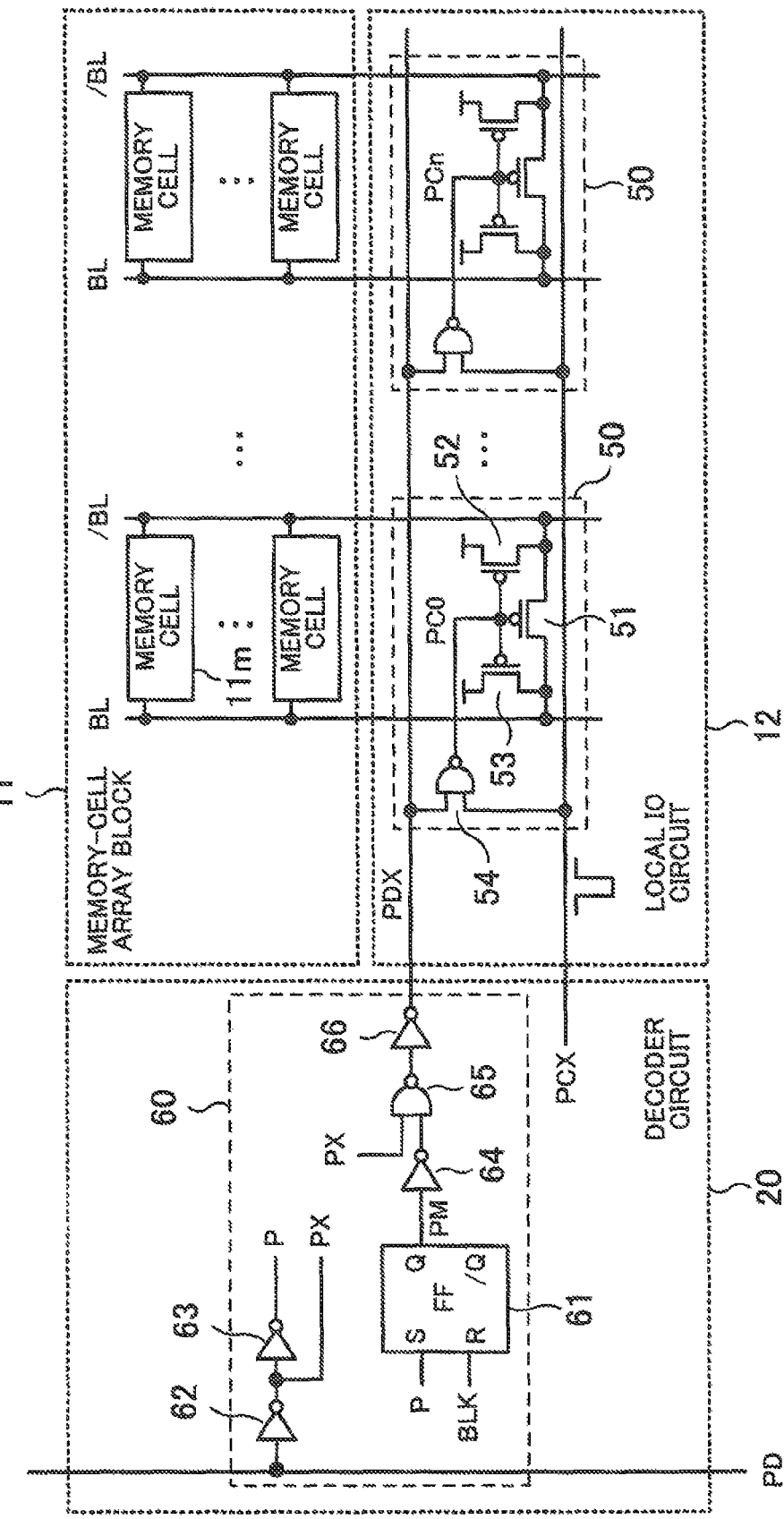
FIG. 4 is a second example circuit diagram of the SRAM macro.

To avoid this, a circuit as illustrated in FIG. 4 may be provided for an SRAM macro 100.

FIG. 4 is an example circuit diagram of the SRAM macro.

FIG. 4 illustrates one of memory-cell array blocks 11, part of a local IO circuit 12 connected to the memory-cell array block 11, and part of a decoder circuit 20 included in the SRAM macro 100. In FIG. 4, word lines are not illustrated.

As in the description above, a predetermined number of memory cells 11m are connected to a corresponding bit line pair BL and /BL in the memory-cell array block 11, and each bit line pair BL and /BL is connected to a corresponding precharge circuit 50 included in the local IO circuit 12. The gates of pMOSs 51, 52, and 53 in each precharge circuit 50 receive output from a corresponding NAND gate circuit 54 as a precharge signal PCi (i=0 to n). The NAND gate circuits 54 receive a signal (mode control signal) PDX output from a mode control circuit 60 provided for the decoder circuit 20 and a precharge control signal PCX.

The mode control circuit 6 includes a set-reset flip-flop (SR-FF) 61 to which a low-power-mode control signal PD and a block selection, signal BLK are input. As an example, the low-power-mode control signal PD (signal P) is input to the S input of the flip-flop 61 via two inverter circuits 62 and 63. The block selection signal BLK used to select a memory-cell array block 11 to be accessed in the SRAM macro 100 is generated using an address signal (row address signal), and is input to the R input of the flip-flop 61.

Herein, the block selection signal BLK is set to the H level for a memory-cell array block to be selected from the plurality of memory-cell array blocks included in the SRAM macro 100, and set to the L level for the remaining memory-cell array blocks that are not to be selected. For example, the block selection signal BLK is at the H level when the memory-cell array block 11 is selected, and at the L level when the memory-cell array block 11 is not selected.

This block selection signal BLK is input to the flip-flop 61 in the mode control circuit 60 together with the low-power-mode control signal PD. Subsequently, the mode control signal PDX generated on the basis of the low-power-mode control signal PD and the block selection signal BLK is input to the precharge circuits 50.

A signal (FF output signal) PM output from the flip-flop 61 in the mode control circuit 60 is input to the NAND gate circuits 54 in the precharge circuits 50 via an inverter circuit 64, a NAND gate circuit 65, and an inverter circuit 66.

The FF output signal PM is inverted at the inverter circuit 64, and the inverted signal is input to the NAND gate circuit 65. The NAND gate circuit 65 receives an inverted signal PX, obtained by inverting the low-power-mode control signal PD at the inverter circuit 62, in addition to the inverted signal obtained by inverting the FF output signal PM. The inverted signal PX obtained by inverting the low-power-mode control signal PD and the inverted signal obtained by inverting the FF output signal PM are input to the NAND gate circuit 65, and a signal output from the NAND gate circuit 65 is inverted at the inverter circuit 66. The signal inverted at the inverter circuit 66 is input to the NAND gate circuits 54 in the precharge circuits 50 as the mode control signal PDX.

The NAND gate circuits 54 in the precharge circuits 50 receive the precharge control signal PCX in addition to the mode control signal PDX. The NAND gate circuits 54 output signals in accordance with the inputs, and the gates of the pMOSs 51, 52, and 53 in the precharge circuits 50 receive the signals as the precharge signals PCi.

In the SRAM macro 100 illustrated in FIG. 4, the mode control signal PDX, input to the NAND gate circuits 54 in the precharge circuits 50 is controlled by the flip-flop 61 that receives the low-power-mode control signal PD and the block selection signal BLK.

Operations of the SRAM macro 100 including the flip-flop 61 will now be described with reference to FIGS. 4 to 6. FIG. 5 is an example truth table of the EE, and FIG. 6 is an example timing chart.

First, the flip-flop 61 is initialized at power-on of the SRAM macro 100 illustrated in FIG. 4. The initialization drives the FF output signal PM from the flip-flop 61 to be set to the L level.

In the normal operation mode in which the SRAM macro 100 is accessible, the low-power-mode control signal PD is at the L level as illustrated in FIG. 6. The low-power-mode control signal PD (signal P) is input to the S input of the flip-flop 61 in the mode control circuit 60 via the inverter circuits 62 and 63. In cases where the memory-cell array block 11 illustrated in FIG. 4 is selected on the basis of the block selection signal BLK, the block selection signal BLK input to the R input of the flip-flop 61 in the mode control circuit 60 is at the H level (see FIG. 6). As a result, the FF output signal PM is set to the L level with reference to FIG. 5.

At this moment, the inverted signal PX, obtained by inverting the low-power-mode control signal PD at the inverter circuit 62, is at the H level. Since both two signals input to the NAND gate circuit 65 are at the H level, the level of the signal output from the NAND gate circuit 65 is set to the L level, and the mode control signal PDX output from the inverter circuit 66 is set to the H level. Accordingly, the bit line pairs BL and /BL will be precharged or left floating on the basis of the precharge control signal PCX.

Before writing or reading in the normal operation mode, the precharge control signal PCX is at the H level (see FIG. 6). In addition, the mode control signal PDX is at the H level as described above. Accordingly, the precharge signals PCi serving as the outputs from the NAND gate circuits 54 are set to the L level (see FIG. 6). As a result, all the pMOSs 51, 52, and 53 in the precharge circuits 50 are turned on, and the bit line pairs BL and /BL that belong to the memory-cell array block 11 are precharged.

During writing or reading in the normal operation mode, the precharge control signal PCX is switched from the H level to the L level (see FIG. 6). With this, the precharge signals PCi serving as the outputs from the NAND gate circuits 54 are switched to the H level (FIG. 6). As a result, all the pMOSs 51, 52, and 53 in the precharge circuits 50 are turned off, and the bit line pairs BL and /BL that belong to the memory-cell array block 11 are left floating. With this, the memory-cell array block becomes writable and readable.

Subsequently, when the precharge control signal PCX is switched from the L level to the H level, the precharge signals PCi are switched to the L level (see FIG. 6), and the bit line pairs BL and /BL are precharged again. In cases where the memory-cell array block 11 is unselected, that is, the block selection signal BLK is switched to the L level, the mode control signal PDX is maintained at the H level since the FF output signal PM is maintained at the L level. That is, the precharge signals PCi are controlled by only the precharge control signal PCX.

When the SRAM macro 100 shifts to the low power mode in which the SRAM macro 100 is not accessed, the low-power-mode control signal PD is switched from the L level to the H level as illustrated in FIG. 6.

In the example of the memory-cell array block 11 illustrated in FIG. 4, the S input of the flip-flop 61 in the mode control circuit 60 receives the H-level signal P via the inverter circuits 62 and 63 when the low-power-mode control signal PD is switched to the H level. Since the block selection signal BLK is at the L level in the low power mode (see FIG. 6), the FF output signal PM is set to the H level with reference to FIG. 5.

At this moment, the inverted signal PX, obtained by inverting the low-power-mode control signal PD at the inverter circuit 62, is at the L level. Since both two signals input to the NAND gate circuit 65 are at the L level, the mode control signal PDX is set to the L level. Accordingly, the precharge signals PCi serving as the outputs from the NAND gate circuits 54 are set to the H level (see FIG. 6) regardless of the value of the precharge control signal PCX (even when the precharge control signal PCX is at the H level). As a result, all the pMOSs 51, 52, and 53 in the precharge circuits 50 are turned off, and the bit line pairs BL and /BL that belong to the memory-cell array block 11 are left floating.

When the SRAM macro 100 shifts to the low power mode, operations similar to those performed on the memory-cell array block 11 illustrated in FIG. 4 are performed on the other memory-cell array blocks included in the SRAM macro 100. Power consumption during standby may be reduced by leaving all the bit line pairs BL and /BL in the SRAM macro 100 floating.

In order to access the SRAM macro 100 again after the low power mode, the low-power-mode control signal PD is switched from the H level to the L level as illustrated in FIG. 6. When the low-power-mode control signal PD is switched from the H level to the L level, the SRAM macro 100 returns from the low power mode to the normal operation mode.

Even when the low-power-mode control signal PD (signal P) is switched from the H level to the L level in the SRAM macro 100, the potential level of the FF output signal PM output from the flip-flop 61 is maintained as long as the block selection signal BLK is not switched to the H level with reference to FIG. 5. That is, the FF output signal PM is maintained at the H level during the low power mode. As a result, the mode control signal PDX is maintained at the L level, and the precharge signals PCi are set to the H level (see FIG. 6) regardless of the value of the precharge control signal PCX (even when the precharge control signal PCX is at the H level). Thus, the bit line pairs BL and /BL are left floating.

The mode control signal PDX is obtained from the logical NAND of the signal from the flip-flop 61. After the SRAM macro 100 returns from the low power mode, the flip-flop 61 is reset (set to, the L level) when the block selection signal BLK is set to the H level with reference to FIG. 5. When the FF output signal PM is set to the L level, the mode control signal PDX is set to the H level, and precharging starts from this moment (see FIG. 6).

The block selection signal BLK is used to select a memory-cell array block to be accessed from all the memory-cell array blocks in the SRAM macro 100. In the SRAM macro 100, the bit line pairs BL and /BL in a memory-cell array block are not precharged until the block selection signal BLK is switched to the H level and thereby the memory-cell array block is selected.

That is, as illustrated in FIG. 6, precharging of the bit line pairs BL and /BL in the selected memory-cell array block 11 starts when the block selection signal BLK is switched to the H level and thereby the memory-cell array block 11 is selected. When the precharge control signal PCX is switched to the L level while the block selection signal BLK is at the H level, the bit line pairs BL and /BL are left floating.

In addition, when once precharging starts, that is, when the block selection signal BLK is switched to the H level while the precharge control signal PCX is at the H level, the precharging continues even when the block selection signal BLK is switched to the L level since the potential level of the FF output signal PM is maintained. For example, when once precharging of a memory-cell array block 11 starts, the precharging continues even when the block selection signal BLK for the memory-cell array block 11 is switched from the H level to the L level so that access to the other memory-cell array blocks are enabled.

When the SRAM macro 100 returns from, the low power mode, similar operations are performed on the other memory-cell array blocks. That is, the bit line pairs BL and /BL connected to a memory-cell array block among the other memory-cell array blocks are not precharged until the block selection signal BLK is switched to the H level and thereby the memory-cell array block is selected.

In this manner, the bit line, pairs BL and /BL in the SRAM macro 100 are precharged in sequence from those in memory-cell array blocks selected on the basis of the block selection signal BLK, that is, memory-cell array blocks to be accessed when the SRAM macro 100 returns from the low power mode. Since the bit line pairs BL and /BL in the SRAM macro 100 are precharged at different times when the SRAM macro 100 returns from the low power mode, the peak of precharging current flowing into the SRAM macro 100 may be dispersed. This reduces the risk that a relatively high current may flow into the SRAM macro 100 abruptly.

Consequently, the SRAM macro 100 reduces the risk of a voltage drop in a chip including the SRAM macro 100 when the SRAM macro 100 returns from the low power mode, and thereby reduces the risk of destruction of memory information in the SRAM macro 100 caused by such a voltage drop.

In addition, the memory-cell array blocks 11 not to be accessed are not precharged in the SRAM macro 100 after the SRAM macro 100 returns from the low power mode. This leads to a reduction in leakage current from the memory cells 11m in the memory-cell array blocks 11 not to be accessed as in the low power mode.

Although an SRAM has been described as an example, the above-described technique may be incorporated into other semiconductor storages such as synchronous dynamic random access memories (SDRAMs) and read-only memories (ROMs).

In addition, in cases where a plurality of semiconductor storages are included in a chip, the above-described technique may be similarly incorporated in all or a part of the semiconductor storages.

The above-described semiconductor storage reduces the risk of a high current flowing thereto, a resultant voltage drop, and destruction of memory information upon transition from a mode in which bit lines are left floating to a mode in which the bit lines are accessible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor storage which includes a plurality of memory-cell array blocks including bit lines connected to memory cells, and operates in a first mode the plurality of memory-cell array blocks to be accessible and in a second mode the bit lines in the plurality of memory-cell array blocks to be in a floating level, comprising:
   a decoder circuit which precharges the bit lines included in only memory-cell array blocks to be accessed among the plurality of memory-cell array blocks in sequence when the semiconductor storage shifts from the second mode to the first mode;
   flip-flops each corresponding to one of the plurality of memory-cell array blocks;
   first inverter circuits each corresponding to one of the plurality of memory-cell array blocks;
   second inverter circuits each corresponding to one of the plurality of memory-cell array blocks;
   third inverter circuits each corresponding to one of the plurality of memory-cell array blocks;
   first NAND gate circuits each corresponding to one of the plurality of memory-cell array blocks; and
   second NAND gate circuits each corresponding to one of the plurality of memory-cell array blocks, wherein:
   each of the flip-flops is configured to receive a selection signal used to select a memory-cell array block to be accessed from the plurality of memory-cell array blocks, and a mode control signal used to change a mode of the semiconductor storage to the first mode or to the second mode;
   each of the first NAND gate circuits is configured to receive an inverted signal obtained by inverting an output from the corresponding flip-flop at the corresponding first inverter circuit, and an inverted signal obtained by inverting the mode control signal at the corresponding second inverter circuit;
   each of the second NAND gate circuits is configured to receive an inverted signal obtained by inverting an output from the corresponding first NAND gate circuit at the corresponding third inverter circuit, and a precharge control signal indicating a timing of precharging, and
   the bit lines in the memory-cell array blocks to be accessed are precharged using outputs from the second NAND gate circuits.

* * * * *